United States Patent
Wu et al.

(10) Patent No.: US 8,476,624 B1
(45) Date of Patent: Jul. 2, 2013

(54) ORGANIC LIGHT EMITTING DIODE (OLED) DEVICE

(75) Inventors: Chang-Yen Wu, Hsinchu (TW); Ting-Yi Cho, Hsinchu (TW); Meng-Ting Lee, Hsinchu (TW); Meng-Huan Ho, Hsinchu (TW); Po-Hsuan Chiang, Hsinchu (TW); Chieh-Wei Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/486,105

(22) Filed: Jun. 1, 2012

(51) Int. Cl.
*H01L 51/52* (2006.01)

(52) U.S. Cl.
USPC .......... 257/40; 257/79; 257/89; 257/E51.022; 313/504; 313/506; 313/512

(58) Field of Classification Search
USPC .............. 257/40, 79, 89, E51.022; 313/504, 313/506, 512
See application file for complete search history.

(56) References Cited

U.S. PATENT DOCUMENTS

| | | | |
|---|---|---|---|
| 7,307,380 B2 | 12/2007 | Yeh et al. | |
| 7,772,596 B2 * | 8/2010 | Nakamura et al. | 257/79 |
| 2006/0214565 A1 * | 9/2006 | Luo et al. | 313/504 |
| 2007/0138947 A1 | 6/2007 | Popovic et al. | |
| 2011/0233600 A1 | 9/2011 | Lin et al. | |
| 2011/0248253 A1 * | 10/2011 | Yamana et al. | 257/40 |

* cited by examiner

*Primary Examiner* — Victor A Mandala
*Assistant Examiner* — Whitney T Moore
(74) *Attorney, Agent, or Firm* — Morris Manning & Martin LLP; Tim Tingkang Xia, Esq.

(57) ABSTRACT

In one aspect of the invention, an organic light emitting diode device has a substrate, a cathode formed on the substrate, an anode spaced-apart from the cathode, a plurality of electroluminescent units stacked between the cathode and the anode, and a plurality of charge generation layers, each of which is formed between two adjacent electroluminescent units. Each electroluminescent unit has an electron-transport layer, an emission layer formed on the electron-transport layer, and a hole-transport layer formed on the emission layer. The electron-transport layer of the first electroluminescent unit is formed on the cathode, defining a first energy barrier, and the anode is formed on the hole-transport layer of the last electroluminescent unit, defining a second energy barrier. The first energy barrier is higher than the second energy barrier. The first electroluminescent unit has a lifetime longer than that of each of the rest electroluminescent units.

28 Claims, 5 Drawing Sheets

| Inventive architecture | CIE 1931 (x, y) | CIE 1976 (u', v') |
|---|---|---|
| Initial | (0.328, 0.375) | (0.192, 0.329) |
| After stress | (0.336, 0.379) | (0.196, 0.331) |
| Color shift | △xy = 0.009 | △u'v' = 0.004 |

| Comparative architecture | CIE 1931 (x, y) | CIE 1976 (u', v') |
|---|---|---|
| Initial | (0.328, 0.375) | (0.192, 0.329) |
| After stress | (0.308, 0.334) | (0.193, 0.314) |
| Color shift | △xy = 0.046 | △u'v' =0.015 |

FIG. 5B

ORGANIC LIGHT EMITTING DIODE (OLED) DEVICE

FIELD OF THE INVENTION

The present invention relates generally to an organic light emitting diode (OLED), and more particularly, to a color-stable inverted tandem OLED device.

BACKGROUND OF THE INVENTION

OLED devices have drawn great attention in display industries, and particularly in the flat-panel display industry, because it is operable with a low driving voltage and capable of generating light of red, green, and blue colors with high luminance efficiency. These unique attributes are derived from a basic OLED structure comprising of a multilayer stack of thin films of small-molecule organic materials sandwiched between an anode and a cathode. Typically, OLED devices are fabricated in forward-stacked structures with the anode placed in contact with the substrate or support on which the OLED is constructed, and the cathode placed on the top of the OLED.

Low power consumption displays typically use an active matrix backplane where thin film transistors (TFT made of a-Si or LTPS) drive current to the OLED. In this case, the OLED stack is located at the source of the TFT, thus the anode of the OLED pixel is directly connected to the source of the driving TFT. Although this manufacturing process is much simpler, the circuit becomes dependent on the characteristics of the OLED materials. Any changes in the OLED voltage due to its aging behavior will affect both the voltage Vg between the gate and the source and the current Ids flowing through the driving TFT and OLED pixel.

Alternately, in an inverted OLED configuration, the deposition of the organic layers is reversed, where the cathode of the OLED is deposited first in order to connect the OLED cathode to the drain of the driving TFT. Thus, if the OLED stack can be located at the drain of the drive TFT, changes in the OLED characteristics affects only the current Ids and not the voltage Vg between gate and source. Thus, the inverted OLED configuration is more compatible to the active-matrix organic light emitting display (AMOLED) to increase the design variability of the active-matrix driving circuit and raise the efficiency of the AMOLED.

In manufacturing of the inverted OLED, the key factors are the charge transported characteristic and the charge injection capability on the interfaces between device electrode and organic material, and between organic material and another organic material. In particular, a critical problem with the inverted OLED exists in that voltage rise over time can be very large. Various designs of the inverted OLED have been proposed to solve the problems, such as using materials of lower work function as the cathodes of the OLED. However, with the constant use and operation of the OLED devices, deterioration of the materials of the organic layers would decrease the intensity of electroluminescence of the OLED device. This creates difficulties in achieving desired luminance.

Moreover, in color inverted OLED devices, materials for emitting lights in different colors would have different degrees of deterioration within the same operation time. Thus, the lifetime of the electroluminescent units of the inverted OLED devices would be different, which results in color shift after long operation time of the OLED devices.

Therefore, a heretofore unaddressed need exists in the art to address the aforementioned deficiencies and inadequacies.

SUMMARY OF THE INVENTION

The present invention, in one aspect, relates to an organic light emitting diode (OLED) device. In one embodiment, the OLED device includes a substrate, a cathode formed on the substrate, a first electroluminescent unit formed on the cathode, a charge generation layer (CGL) formed on the first electroluminescent unit, a second electroluminescent unit formed on charge generation layer, and an anode formed on the second electroluminescent unit. Each of the first and second electroluminescent units includes an electron-transport layer (ETL), an emission layer (EML) formed on the electron-transport layer, and a hole-transport layer (HTL) formed on the emission layer, such that the electron-transport layer of the first electroluminescent unit is formed on the cathode, defining a first energy barrier between the electron-transport layer of the first electroluminescent unit and the cathode, and the anode is formed on the hole-transport layer of the second electroluminescent unit, defining a second energy barrier between the hole-transport layer of the second electroluminescent unit and the anode, where the first energy barrier is higher than the second energy barrier. The first electroluminescent unit has a lifetime longer than that of the second electroluminescent unit.

In one embodiment, the cathode is formed of an electrically conductive material having a high work function such that the first energy barrier is higher than the second energy barrier. The conductive material includes, for example, Al, Ag, Au, Ni, Pt, PEDOT, ITO, IZO, ZnO, AZO(Al:ZnO), GITO(Ga:In:Sn:O), ZITO(Zn:In:Sn:O), or a combination thereof.

In one embodiment, the electron-transport layer of each of the first and second electroluminescent units is formed of $Alq_3$, BCP, BPhen, MADN, TPBI, or TPyPhB.

In one embodiment, the electron-transport layer of at least one of the first and second electroluminescent units is doped with an n-type of one or more dopants.

In one embodiment, the electron-transport layer of each of the first and second electroluminescent units has a thickness in a range of about 1 nm to about 500 nm.

In one embodiment, the hole-transport layer of each of the first and second electroluminescent units is formed of NPB, HAT-CN, TCTA, or CuPC.

In one embodiment, the hole-transport layer of at least one of the first and second electroluminescent units is doped with a p-type of one or more dopants.

In one embodiment, the hole-transport layer of each of the first and second electroluminescent units has a thickness in a range of about 1 nm to about 500 nm.

In one embodiment, the emission layer of each of the first and second electroluminescent units comprises one or more light-emitting layers formed of a fluorescent material, a phosphorescent material, or a combination thereof.

In one embodiment, each of the fluorescent material and the phosphorescent material is capable of emitting red light, green light, blue light, or a combination thereof.

In one embodiment, the emission layer of the first electroluminescent unit is formed of a fluorescent material for emitting blue light, while the emission layer of the second electroluminescent unit is formed of a compound of a first phosphorescent material for emitting red light and a second phosphorescent material for emitting green light. The emission layer of each of the first and second electroluminescent units has a thickness in a range of about 1 nm to about 100 nm.

In one embodiment, the charge generation layer comprises one or more layers formed of organic materials, inorganic materials, metals, metallic oxides, or a combination thereof.

In one embodiment, the charge generation layer comprises an n-type doped electron-transport layer, a p-type doped hole-transport layer, or a combination thereof.

In one embodiment, the n-type doped electron-transport layer comprises an n-type dopant and an electron-transporting material, and wherein the p-type doped hole-transport layer comprises a p-type dopant and a hole-transporting material.

In another aspect of the present invention, an organic light emitting diode (OLED) device includes a substrate, a cathode on the substrate, an anode, spaced-apart from the cathode, a plurality of electroluminescent units stacked between the cathode and the anode; and a plurality of charge generation layers, each of which is formed between two adjacent electroluminescent units. Each electroluminescent unit comprises an electron-transport layer (ETL), an emission layer (EML) formed on the electron-transport layer, and a hole-transport layer (HTL) formed on the emission layer, such that the electron-transport layer of the first electroluminescent unit is formed on the cathode, defining a first energy barrier, and the anode is formed on the hole-transport layer of the last electroluminescent unit, defining a second energy barrier. The first energy barrier is higher than the second energy barrier. The first electroluminescent unit has a lifetime longer than that of each of the rest electroluminescent units.

In one embodiment, the electron-transport layer of each electroluminescent unit is formed of $Alq_3$, BCP, BPhen, MADN, TPBI, or TPyPhB.

In one embodiment, the electron-transport layer of at least one of the first and second electroluminescent units is doped with an n-type of one or more dopants.

In one embodiment, the hole-transport layer of each electroluminescent unit is formed of NPB, HAT-CN, TCTA, or CuPC.

In one embodiment, the hole-transport layer of at least one of the first and second electroluminescent units is doped with a p-type of one or more dopants.

In one embodiment, the emission layer of each electroluminescent unit comprises one or more light-emitting layers formed of a fluorescent material, a phosphorescent material, or a combination thereof.

In one embodiment, each of the fluorescent material and the phosphorescent material is capable of emitting red light, green light, blue light, or a combination thereof.

In one embodiment, the emission layer of the first electroluminescent unit is formed of a fluorescent material for emitting blue light, while the emission layer of the second electroluminescent unit is formed of a compound of a first phosphorescent material for emitting red light and a second phosphorescent material for emitting green light.

In one embodiment, each charge generation layer comprises one or more layers formed of organic materials, inorganic materials, metals, metallic oxides, or a combination thereof.

In one embodiment, each charge generation layer comprises an n-type doped electron-transport layer, a p-type doped hole-transport layer, or a combination thereof.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The term, as used herein, "electron transporting material" refers to a charge carrying material for which charge transport is predominantly electron transport.

As used herein, the term "hole transporting material" refers to a charge carrying material for which charge transport is predominantly hole transport.

The description will be made as to the embodiments of the present invention in conjunction with the accompanying drawings in FIGS. 1-5B. In accordance with the purposes of this invention, as embodied and broadly described herein, this invention, in one aspect, relates to a color-stable inverted tandem OLED device.

Without intent to limit the scope of the invention, structures and characterizations of the OLED device according to one embodiment of the present invention are described below.

Figure 1:
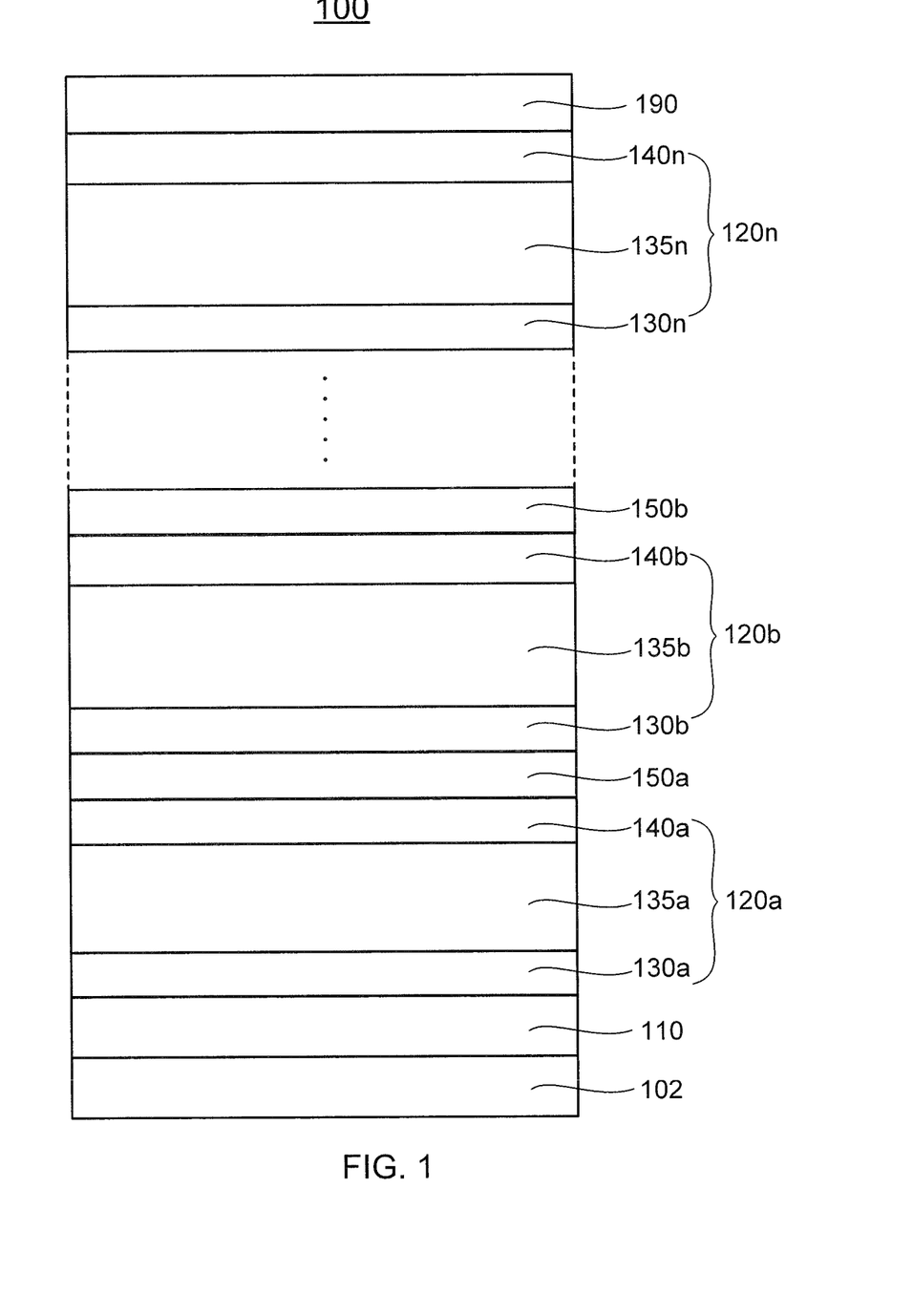
FIG. 1 shows schematically an OLED device according to one embodiment of the present invention.

FIG. 1 shows schematically an OLED device according to one embodiment of the present invention. As shown in FIG. 1, the OLED device 100 has an inverted tandem structure, including a substrate 102, a cathode 110 formed on the substrate 102, an anode 190 shown on the top to be spaced-apart from the cathode 110, a plurality of electroluminescent units (three electroluminescent units 120a, 120b and 120n are shown in FIG. 1) stacked between the cathode 110 and the anode 190, and a plurality of charge generation layers (two charge generation layers 150a and 150b are shown in FIG. 1), each of which is formed between two adjacent electroluminescent units. In other words, the first electroluminescent unit 120a is formed on the cathode 110, the anode 190 is formed on the last electroluminescent unit 120n, and the charge generation layers 150a, 150b, . . . are formed between each of the two adjacent electroluminescent units. For example, the charge generation layer 150a is formed between the two adjacent electroluminescent units 120a and 120b, and the charge generation layer 150b is formed between the electroluminescent unit 120b and another electroluminescent unit (not shown in FIG. 1) above the charge generation layer 150b.

In one embodiment, each of the electroluminescent units 120a, 120b, . . . , 120n includes an electron-transport layer (ETL) 130, an emission layer (EML) 135 formed on the electron-transport layer 130, and a hole-transport layer (HTL) 140 formed on the emission layer 135. For example, the electroluminescent unit 120a includes the electron-transport layer 130a, the emission layer 135a formed on the electron-transport layer 130a, and the hole-transport layer 140a formed on the emission layer 135a. In this way, the electron-transport layer 130a of the first electroluminescent unit 120a is formed on the cathode 110, defining a first energy barrier between the electron-transport layer 130a of the first electroluminescent unit 130 and the cathode 110, and the anode 190 is formed on the hole-transport layer 140n of the last electroluminescent unit 120n, defining a second energy barrier between the hole-transport layer 140n of the last electroluminescent unit 120n and the anode 190.

Specifically, the first energy barrier is defined by ($E_{LUMO}$-$E_C$), where $E_{LUMO}$ is an energy level in the lowest unoccupied molecular orbital (LUMO) of the electron-transport layer 130a of the first electroluminescent unit 120a, and $E_C$ is a work function of the cathode 110. The second energy barrier is defined by ($E_{HOMO}$-$E_A$), where $E_{HOMO}$ is an energy level in the highest occupied molecular orbital (HOMO) of the hole-transport layer 140n of the last electroluminescent unit 120n, and $E_A$ is a work function of the anode 190. According to the invention, the first energy barrier is higher than the second energy barrier.

Additionally, each electroluminescent unit may have a lifetime that depends upon the material forming the corresponding emission layer thereof. The lifetime of each of the electroluminescent units 120a, 120b, . . . , 120n may be different from each other. According to the present invention, the lifetime of the first electroluminescent unit 120a is longer than that of each of the rest electroluminescent units 120b, . . . , 120n. In other words, the first electroluminescent unit 120a, which is close to the cathode 110 with the higher first energy barrier, has the longest lifetime among the electroluminescent units of the OLED device. Thus, the overall performance of the intensity of electroluminescence of the electroluminescent units of the OLED device can be maintained stable.

In one embodiment, the cathode 110 of formed of an electrically conductive material having a high work function such that the first energy barrier ($E_{LUMO}$-$E_C$) is higher than the second energy barrier ($E_{HOMO}$-$E_A$). The conductive material includes, but not limited to, Al, Ag, Au, Ni, Pt, PEDOT, ITO, IZO, ZnO, AZO(Al:ZnO), GITO(Ga:In:Sn:O), ZITO(Zn:In:Sn:O), or a combination thereof.

In one embodiment, the electron-transport layers 130a, 130b, . . . , 130n of the electroluminescent units 120a, 120b, . . . , 120n may be formed of, but not limited to, $Alq_3$, BCP, BPhen, MADN, TPBI, TPyPhB, or the like. The hole-transport layers 140a, 140b, . . . , 140n of the electroluminescent units 120a, 120b, . . . , 120n may be formed of, but not limited to, NPB, HAT-CN, TCTA, CuPC, or the like. The thickness of each of the electron-transport layers 130a, 130b, . . . , 130n, and the hole-transport layers 140a, 140b, . . . , 140n can be in a range of, but not limited to, about 1 nm to about 500 nm. Additionally, some or all of the electron-transport layers 130a, 130b, . . . , 130n may be doped with a first type of one or more dopants. Similarly, some or all of the hole-transport layers 140a, 140b, . . . , 140n may also be doped with a second type of one or more dopants. The first type of dopants may be an n-type dopant, while the second type of dopants may be a p-type dopant.

The emission layers 135a, 135b, . . . , 135n of the electroluminescent units 120a, 120b, . . . , 120n may include one or more light-emitting layers. The light-emitting layers can be formed of a fluorescent material, a phosphorescent material, or a combination thereof. Each of the fluorescent material and the phosphorescent material is capable of emitting red light, green light, blue light, or a combination thereof. In one embodiment, each light-emitting layer of the emission layers 135a, 135b, . . . , 135n is formed of a material emitting light of a single color, for example, blue light, the OLED device is a blue light OLED device. In another embodiment, each light-emitting layer of the emission layers 135a, 135b, . . . , 135n is formed of a different material emitting light of different colors, the OLED device is a mutli-color OLED device or a white OLED device. The thickness of each emission layer can be in a range of, but not limited to, about 1 nm to about 100 nm.

The intensity of electroluminescence of the emission layer is dependent on the material of the emission layer, and the lifetime of the electroluminescent unit is dependent on the intensity of electroluminescence of the emission layer. Thus, the emission layer 135a of the electroluminescent units 120a would be formed with a material that has higher intensity of electroluminescence. Generally, the lifetime of an OLED formed of a fluorescent material is longer than that of an OLED formed of a phosphorescent material. Furthermore, for the same type material, the lifetime of a red light OLED is longer than that of a green light OLED, which in turn, longer than that of a blue light OLED. According to the invention, it is preferred that the emission layer of the first electroluminescent unit is formed of a fluorescent material. In one embodiment, the emission layer of the first electroluminescent unit 120a is formed of a fluorescent material for emitting blue light, while the emission layer of the second electroluminescent unit 120b is formed of a compound of a first phosphorescent material for emitting red light and a second phosphorescent material for emitting green light.

The charge generation layers 150a, 150b, . . . may include one or more layers formed of organic materials, inorganic materials, metals, metallic oxides, or a combination thereof. For example, the organic materials include, but not limited to, HAT-CN, $F_4$-TCNQ, CuPC, LiQ, BPhen, $Alq_3$, NPB or the like. The inorganic materials include, but not limited to, LiF, $Cs_2CO_3$, CsF, or the like. The metals include, but not limited to, Al, Ag, Au, Mg, Ca, Li, or the like. The metallic oxides include, but not limited to, ITO, IZO,AZO,$MoO_3$, $WO_3$, $V_2O_5$, or the like. Each charge generation layer may be formed of a same material or a different material. The thickness of each charge generation layer is in a range of, but not limited to, about 1 nm to about 100 nm.

Additionally, each of the charge generation layers 150a, 150b, . . . may also doped with dopants. For example, each charge generation layer may include an n-type doped electron-transport layer, a p-type doped hole-transport layer, or a combination thereof. The n-type doped electron-transport layer comprises an n-type dopant and an electron-transporting material, and wherein the p-type doped hole-transport layer comprises a p-type dopant and a hole-transporting material.

Figure 2:
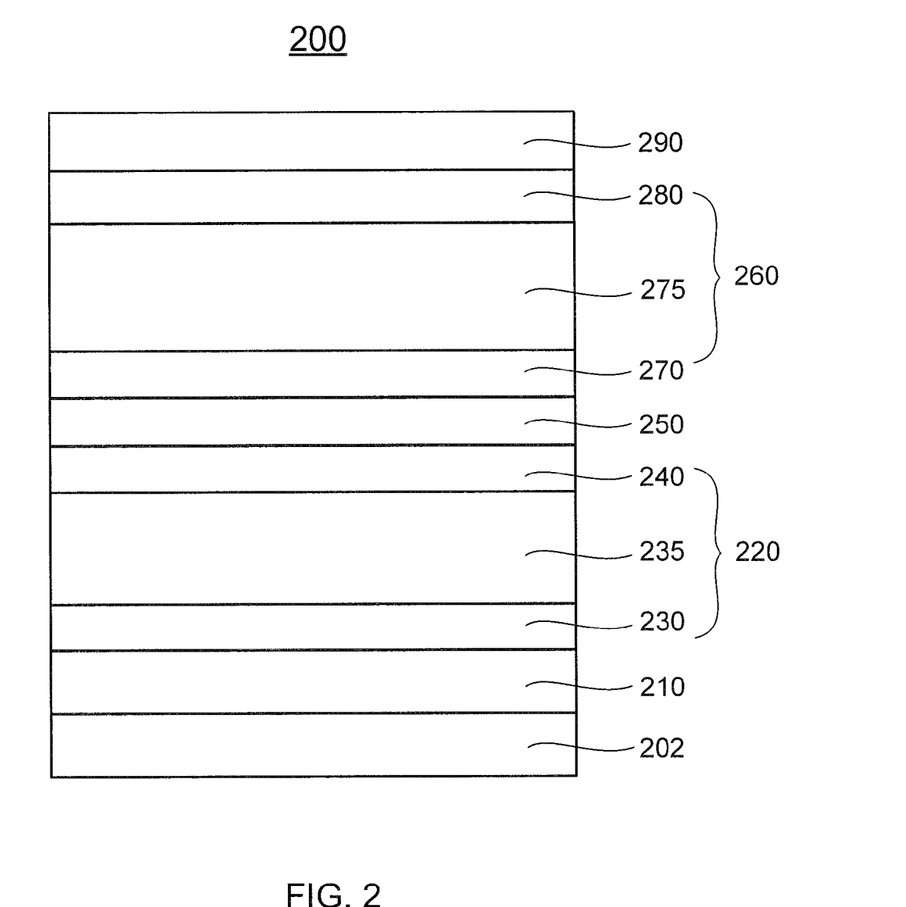
FIG. 2 shows schematically an OLED device according to one embodiment of the present invention.

FIG. 2 shows schematically an OLED device of two stacked electroluminescent units according to one embodiment of the present invention. As shown in FIG. 2, the OLED device 200 includes a substrate 202, a cathode 210 formed on the substrate 202, a first electroluminescent unit 220 formed on the cathode 210, a charge generation layer 250 formed on the first electroluminescent unit 220, a second electroluminescent unit 260 formed on charge generation layer 250, and an anode 290 formed on the second electroluminescent unit 260. The OLED device 200 shown in FIG. 2 is structurally similar to the OLED device 100 shown in FIG. 1, except that the OLED device 200 has two electroluminescent units 220 and 260 stacked between the cathode 210 and the anode 290, and the charge generation layer 250 is formed between the two adjacent electroluminescent units 220 and 260.

The first electroluminescent unit 220 includes an electron-transport layer 230, an emission layer 235 formed on the electron-transport layer 230, and a hole-transport layer 240 formed on the emission layer 235. Similarly, the second electroluminescent unit 260 includes an electron-transport layer 270, an emission layer 275 formed on the electron-transport layer 270, and a hole-transport layer 280 formed on the emission layer 275. In this arrangement, the electron-transport layer 230 of the first electroluminescent unit 220 is formed on the cathode 210, and the anode 290 is formed on the hole-transport layer 280 of the second electroluminescent unit 260.

According to the invention, a first energy barrier at the electron-transport layer 230 of the first electroluminescent unit 220 and the cathode 210 is higher than a second energy barrier at the hole-transport layer 280 of the second electroluminescent unit 260 and the anode 290. Specifically, the first energy barrier is defined by ($E_{LUMO}$-$E_C$), where $E_{LUMO}$ is an energy level in the lowest unoccupied molecular orbital (LUMO) of the electron-transport layer 230 of the first electroluminescent unit 220, and $E_C$ is a work function of the cathode 210. The second energy barrier is defined by ($E_{HOMO}$-$E_A$), where $E_{HOMO}$ is an energy level in the highest occupied molecular orbital (HOMO) of the hole-transport layer 280 of the second electroluminescent unit 260, and $E_A$ is a work function of the anode 290.

Further, the emission layers 235 and 275 of the first and second electroluminescent units 220 and 260 may include one or more light-emitting layers. The light-emitting layers can be formed of a fluorescent material, a phosphorescent material, or a combination thereof. In one embodiment, each of the fluorescent material and the phosphorescent material is capable of emitting red light, green light, blue light, or a combination thereof. The thickness of the emission layers 235 and 275 of the first and second electroluminescent units 220 and 260 can be in a range of about 1 nm to about 100 nm. For example, in FIG. 2, the emission layer 235 of the first electroluminescent unit 220 is formed of a fluorescent material for emitting blue light, and the emission layer 275 of the second electroluminescent unit 260 is formed of a compound of a first phosphorescent material for emitting red light and a second phosphorescent material for emitting green light. Thus, the first electroluminescent unit 220, which is close to the cathode 210, would have a lifetime longer than that of the second electroluminescent unit 260 because the fluorescent materials are more durable than phosphorescent materials as light-emitting layers. Thus, the overall performance of the intensity of electroluminescence of the electroluminescent units 220 and 260 can be maintained stable to realize a color-stable OLED device with less color shift.

The cathode 210 of formed of an electrically conductive material having a high work function such that the first energy barrier ($E_{LUMO}$-$E_C$) is higher than the second energy barrier ($E_{HOMO}$-$E_A$). The conductive material includes, but not limited to, Al, Ag, Au, Ni, Pt, PEDOT, ITO, IZO, ZnO, AZO(Al:ZnO), GITO(Ga:In:Sn:O), ZITO(Zn:In:Sn:O), or a combination thereof.

The electron-transport layers 230 and 270 of the first and second electroluminescent units 220 and 260 is formed of, but not limited to, $Alq_3$, BCP, BPhen, MADN, TPBI, or TPyPhB, and the thickness of the electron-transport layers 230 and 270 of the first and second electroluminescent units 220 and 260 can be in a range of about 1 nm to about 500 nm. The hole-transport layers 240 and 280 of the first and second electroluminescent units 220 and 260 is formed of, but not limited to, NPB, HAT-CN, TCTA, or CuPC, and the thickness of the hole-transport layers 240 and 280 of the first and second electroluminescent units 220 and 260 can be in a range of about 1 nm to about 500 nm.

In addition, the electron-transport layer 230/270 of the first electroluminescent unit 220 and/or the second electroluminescent unit 260 may be doped with an n-type of one or more dopants. The hole-transport layer 240/280 of the first electroluminescent unit 220 and/or the second electroluminescent unit 260 may be doped with a p-type of one or more dopants.

The charge generation layer 250 may include one or more layers formed of organic materials, inorganic materials, metals, metallic oxides, or a combination thereof. In one embodiment, the charge generation layer 250 is a doped layer, such as an n-type doped electron-transport layer, a p-type doped hole-transport layer, or a combination thereof. The n-type doped electron-transport layer comprises an n-type dopant and an electron-transporting material, and wherein the p-type doped hole-transport layer comprises a p-type dopant and a hole-transporting material.

Figure 3A:
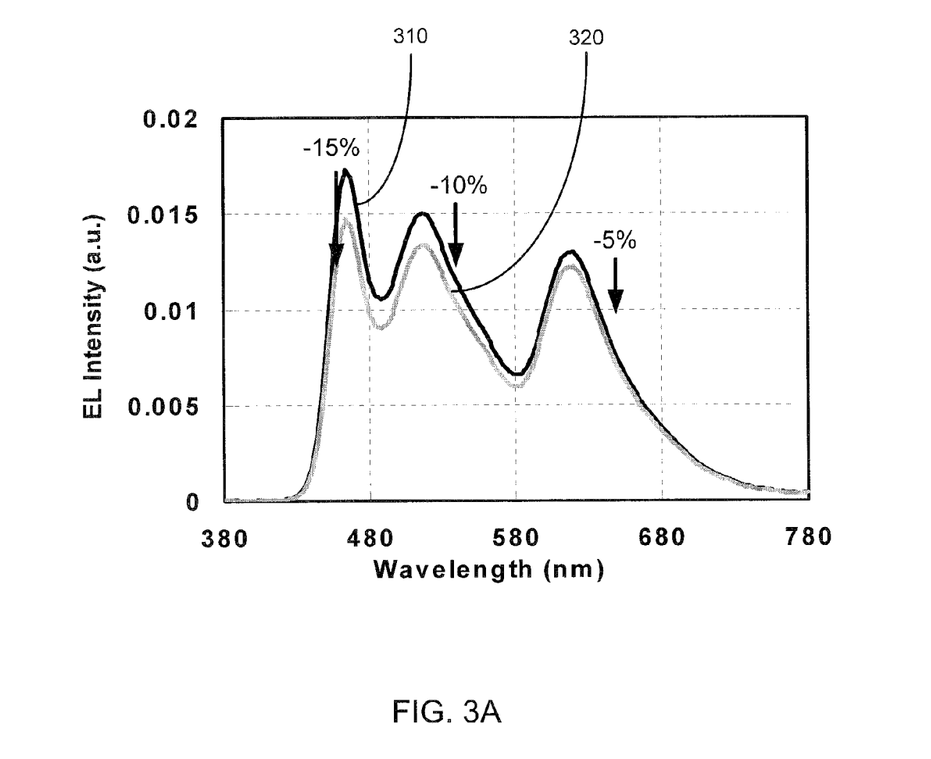
FIG. 3A shows simulated performance of the OLED device shown in FIG. 2.
Figure 3B:
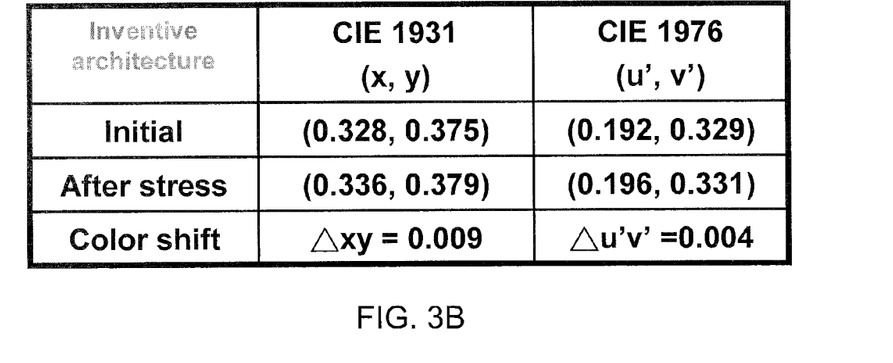
FIG. 3B shows a table of color shift information of the OLED device shown in FIG. 2.

FIGS. 3A and 3B show the simulated results for performance of the OLED device 200 of FIG. 2, where the emission layer 235 of the first electroluminescent unit 220 is formed of a fluorescent material for emitting blue light, while the emission layer 275 of the second electroluminescent unit 260 is formed of a phosphorescent material for emitting red and green light. Specifically, FIG. 3A shows curves 310 and 320 of the emitted light intensity against wavelength of the OLED device 200, where the intensity of electroluminescence of the OLED device 200 is measured at different wavelength for which the OLED device 200 is in its initial condition (curve 310) and the OLED device is in a condition of 10,000 hours stress (curve 320), respectively. FIG. 3B shows a table of color shift information of the OLED device 200.

As shown in FIG. 3A, after the 10,000 hours stress test, the OLED device 200 shows a 15% drop of the intensity of electroluminescence for blue light (wavelength about 475 nm), a 10% drop of the intensity of electroluminescence for green light (wavelength about 510 nm), and a 5% drop of the intensity of electroluminescence for red light (wavelength about 650 nm). The drop of the intensity of electroluminescence for blue light is higher than that of green light or red light because the first electroluminescent unit 220, in which the emission layer 235 is formed for emitting blue light, is close to the cathode 210 to sustain the higher first energy barrier. Accordingly, the longer lifetime of the first electroluminescent unit 220 compensates the higher drop of the intensity of electroluminescence such that the overall performance of the intensity of electroluminescence of the electroluminescent units 220 and 260 is stable to reduce the color shift of the OLED device.

The color stable overall performance of the OLED device 200 is further shown in the table of FIG. 3B. In the table of FIG. 3B, two methods are used to determine the color shift of the OLED device 200. One method is the CIE 1931 color space method using the parameters (x, y), in which the parameter x refers to a mix (a linear combination) of the cone response curves chosen to be orthogonal to luminance and nonnegative, and the parameter y refers to the luminance. The other method is the CIE 1976 color space method using the parameters (u', v') as chromaticity coordinates, in which the relationship between the parameters (x, y) and (u', v') are:

$$u' = \frac{4x}{-2x + 12y + 3} \quad (1)$$

$$v' = \frac{6y}{-2x + 12y + 3} \quad (2)$$

As shown in the table of FIG. 3B, after the 10,000 hours stress test, the color shift of the OLED device 200 using the CIE 1931 method is about $\Delta xy=0.009$, and the color shift of the OLED device 200 using the CIE 1979 method is about $\Delta u'v'=0.004$. Both color shift values are considered relatively small.

In comparison to the OLED device 200 of FIG. 2, a comparative example with similar structure is provided, with the first electroluminescent unit having a lifetime shorter than that of the second electroluminescent unit.

Figure 4:
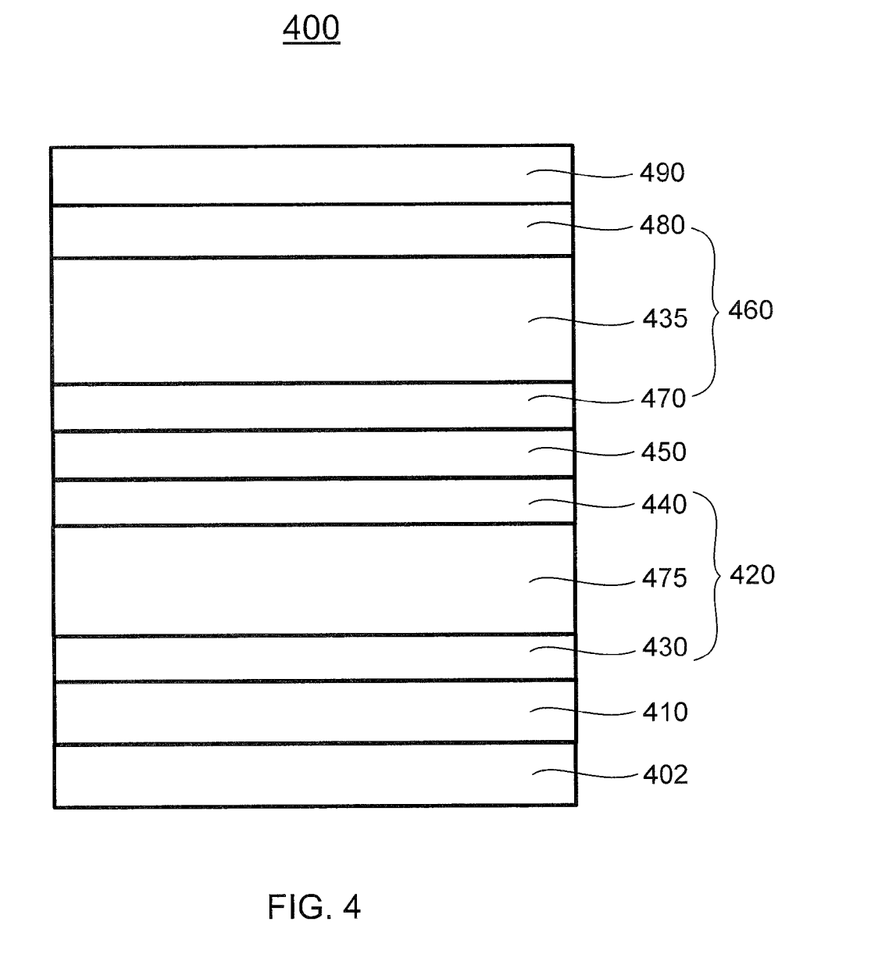
FIG. 4 shows schematically an OLED device according to a comparative example where the first electroluminescent unit has a lifetime shorter than that of the second electroluminescent unit.

FIG. 4 shows schematically an OLED device according to a comparative example where the first electroluminescent unit has a lifetime shorter than that of the second electroluminescent unit. In FIG. 4, the OLED device 400 has a similar structure to the OLED device 200 in FIG. 2, including a substrate 402, a cathode 410 formed on the substrate 402, a first electroluminescent unit 420 formed on the cathode 410, a charge generation layer 450 formed on the first electroluminescent unit 420, a second electroluminescent unit 460 formed on charge generation layer 450, and an anode 490 formed on the second electroluminescent unit 460. Each of the first and second electroluminescent units 420 and 460 includes an electron-transport layer, an emission layer formed on the electron-transport layer, and a hole-transport layer formed on the emission layer. The difference between the OLED device 400 of FIG. 4 and the OLED device 200 of FIG. 2 is that the emission layer 475 of the first electroluminescent unit 420 is formed of a phosphorescent material for emitting red and green light, and the emission layer 435 of the second electroluminescent unit 460 is formed of a fluorescent material for emitting blue light. In other words, the OLED device 400 of FIG. 4 is obtained by switching the emission layers of the first and second electroluminescent unit 220 and 260 in the OLED device 200 of FIG. 2. Thus, the first electroluminescent unit 420 would have a lifetime shorter than that of the second electroluminescent unit 460.

Figure 5A:
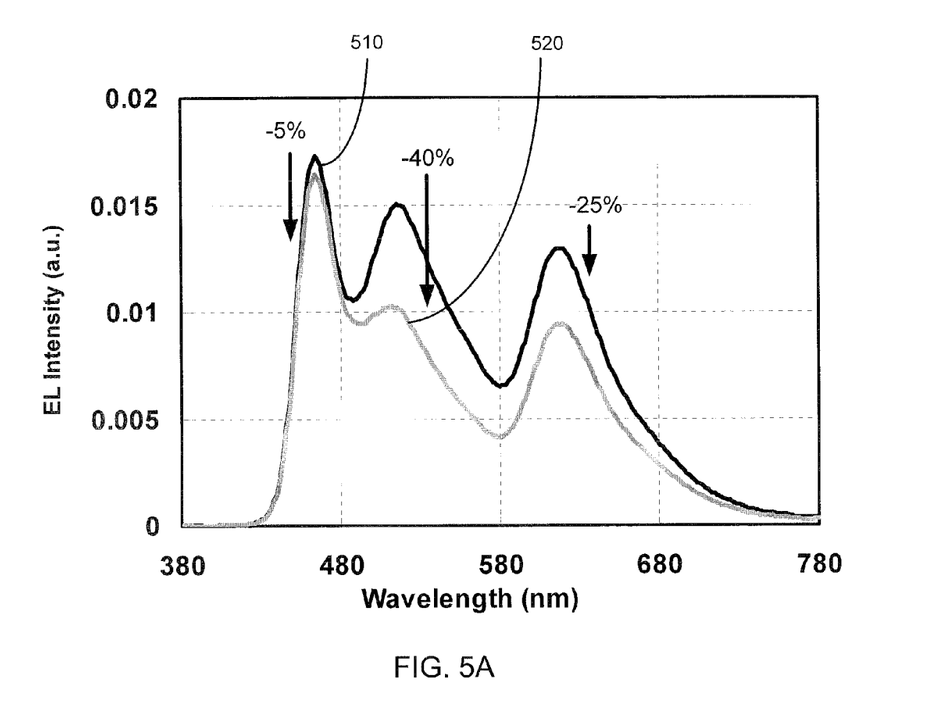
FIG. 5A shows simulated performance of the OLED device shown in FIG. 4.
Figure 5B:
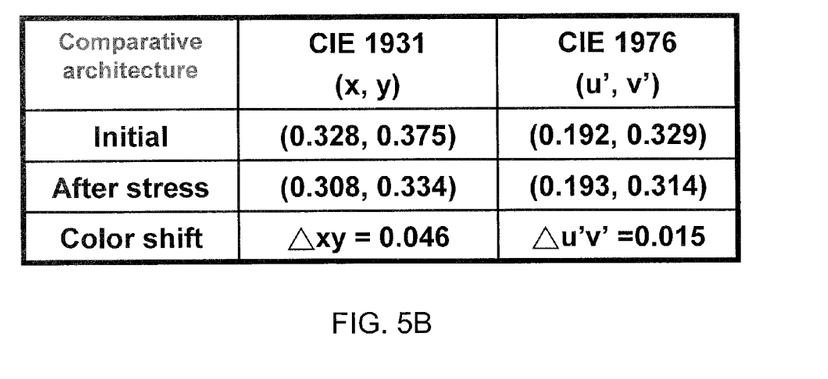
FIG. 5B shows a table of color shift information of the OLED device shown in FIG. 4.

FIGS. 5A and 5B show the simulated results for performance of the OLED device 400 of FIG. 4, where the emission layer 475 of the first electroluminescent unit 420 is formed of a phosphorescent material for emitting red and green light, and the emission layer 435 of the second electroluminescent unit 460 is formed of a fluorescent material for emitting blue light. Specifically, FIG. 5A shows curves 310 and 320 of the emitted light intensity against wavelength of the OLED device 400, where the intensity of electroluminescence of the OLED device 400 is measured at different wavelength for which the OLED device 400 is in its initial condition (curve 510) and the OLED device is in a condition of 10,000 hours stress (curve 520), respectively. FIG. 5B shows a table of color shift information of the OLED device 400.

As shown in FIG. 5A, after the 10,000 hours stress test, the OLED device 400 shows a 5% drop of the intensity of electroluminescence for blue light (wavelength about 475 nm), a 40% drop of the intensity of electroluminescence for green light (wavelength about 510 nm), and a 25% drop of the intensity of electroluminescence for red light (wavelength about 650 nm). Comparing the results to FIG. 3A, the drops of the intensity of electroluminescence for green light and red light increase significantly. Further, as shown in the table of FIG. 5B, after the 10,000 hours stress test, the color shift of the OLED device 400 using the CIE 1931 method is about $\Delta xy=0.046$, and the color shift of the OLED device 400 using the CIE 1979 method is about $\Delta u'v'=0.015$, which are significantly larger than that of the OLED 200. Accordingly, the result shows that the OLED device of the present invention has the advantage of being more stable on the overall performance of the intensity of electroluminescence and reducing the color shift.

In sum, the present invention provides an OLED device with the inverted tandem structure, in which the first energy barrier at the electron-transport layer of the first electroluminescent unit and the cathode is higher than a second energy barrier at the hole-transport layer of the second electroluminescent unit and the anode. By placing the first electroluminescent unit, which has a longer lifetime than the rest of the electroluminescent units of the OLED device, close to the cathode, the longer lifetime of the first electroluminescent unit compensates the higher drop of the intensity of electroluminescence such that the overall performance of the intensity of electroluminescence of the OLED device is stable to reduce the color shift of the OLED device.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An organic light emitting diode (OLED) device, comprising:
    (a) a substrate;
    (b) a cathode formed on the substrate;
    (c) a first electroluminescent unit formed on the cathode;
    (d) a charge generation layer (CGL) formed on the first electroluminescent unit;
    (e) a second electroluminescent unit formed on charge generation layer; and
    (f) an anode formed on the second electroluminescent unit, wherein each of the first and second electroluminescent units comprises an electron-transport layer (ETL), an emission layer (EML) formed on the electron-transport layer, and a hole-transport layer (HTL) formed on the emission layer, such that the electron-transport layer of the first electroluminescent unit is formed on the cathode, defining a first energy barrier, and the anode is formed on the hole-transport layer of the second electroluminescent unit, defining a second energy barrier, wherein the first energy barrier is higher than the second energy barrier, and wherein the first electroluminescent unit has a lifetime longer than that of the second electroluminescent unit.

2. The OLED device of claim 1, wherein the cathode is formed of an electrically conductive material having a high work function.

3. The OLED device of claim 2, wherein the conductive material comprises Al, Ag, Au, Ni, Pt, PEDOT, ITO, IZO, ZnO, AZO(Al:ZnO), GITO(Ga:In:Sn:O), ZITO(Zn:In:Sn:O), or a combination thereof.

4. The OLED device of claim 1, wherein the electron-transport layer of each of the first and second electroluminescent units is formed of $Alq_3$, BCP, BPhen, MADN, TPBI, or TPyPhB.

5. The OLED device of claim 1, wherein the electron-transport layer of at least one of the first and second electroluminescent units is doped with an n-type of one or more dopants.

6. The OLED device of claim 1, wherein the electron-transport layer of each of the first and second electroluminescent units has a thickness in a range of about 1 nm to about 500 nm.

7. The OLED device of claim 1, wherein the hole-transport layer of each of the first and second electroluminescent units is formed of NPB, HAT-CN, TCTA, or CuPC.

8. The OLED device of claim 1, wherein the hole-transport layer of at least one of the first and second electroluminescent units is doped with a p-type of one or more dopants.

9. The OLED device of claim 1, wherein the hole-transport layer of each of the first and second electroluminescent units has a thickness in a range of about 1 nm to about 500 nm.

10. The OLED device of claim 1, wherein the emission layer of each of the first and second electroluminescent units comprises one or more light-emitting layers formed of a fluorescent material, a phosphorescent material, or a combination thereof.

11. The OLED device of claim 10, wherein each of the fluorescent material and the phosphorescent material is capable of emitting red light, green light, blue light, or a combination thereof.

12. The OLED device of claim 11, wherein the emission layer of the first electroluminescent unit is formed of a fluorescent material for emitting blue light, wherein the emission layer of the second electroluminescent unit is formed of a compound of a first phosphorescent material for emitting red light and a second phosphorescent material for emitting green light.

13. The OLED device of claim 1, wherein the emission layer of each of the first and second electroluminescent units has a thickness in a range of about 1 nm to about 100 nm.

14. The OLED device of claim 1, wherein the charge generation layer comprises one or more layers formed of organic materials, inorganic materials, metals, metallic oxides, or a combination thereof.

15. The OLED device of claim 14, wherein the charge generation layer comprises an n-type doped electron-transport layer, a p-type doped hole-transport layer, or a combination thereof.

16. The OLED device of claim 15, wherein the n-type doped electron-transport layer comprises an n-type dopant and an electron-transporting material, and wherein the p-type doped hole-transport layer comprises a p-type dopant and a hole-transporting material.

17. An organic light emitting diode (OLED) device, comprising:
   (a) a substrate;
   (b) a cathode on the substrate;
   (c) an anode, spaced-apart from the cathode;
   (d) a plurality of electroluminescent units stacked between the cathode and the anode; and
   (e) a plurality of charge generation layers (CGL), each of which is formed between two adjacent electroluminescent units,
   wherein each electroluminescent unit comprises an electron-transport layer (ETL), an emission layer (EML) formed on the electron-transport layer, and a hole-transport layer (HTL) formed on the emission layer, such that the electron-transport layer of the first electroluminescent unit is formed on the cathode, defining a first energy barrier, and the anode is formed on the hole-transport layer of the last electroluminescent unit, defining a second energy barrier, wherein the first energy barrier is higher than the second energy barrier, and wherein the first electroluminescent unit has a lifetime longer than that of each of the rest electroluminescent units.

18. The OLED device of claim 17, wherein the electron-transport layer of each electroluminescent unit is formed of $Alq_3$, BCP, BPhen, MADN, TPBI, or TPyPhB.

19. The OLED device of claim 17, wherein the electron-transport layer of at least one of the plurality of electroluminescent units is doped with an n-type of one or more dopants.

20. The OLED device of claim 17, wherein the hole-transport layer of each electroluminescent unit is formed of NPB, HAT-CN, TCTA, or CuPC.

21. The OLED device of claim 17, wherein the hole-transport layer of at least one of the plurality of electroluminescent units is doped with a p-type of one or more dopants.

22. The OLED device of claim 17, wherein the emission layer of each electroluminescent unit comprises one or more light-emitting layers formed of a fluorescent material, a phosphorescent material, or a combination thereof.

23. The OLED device of claim 22, wherein each of the fluorescent material and the phosphorescent material is capable of emitting red light, green light, blue light, or a combination thereof.

24. The OLED device of claim 23, wherein the emission layer of the first electroluminescent unit is formed of a fluorescent material for emitting blue light, wherein the emission layer of the second electroluminescent unit is formed of a compound of a first phosphorescent material for emitting red light and a second phosphorescent material for emitting green light.

25. The OLED device of claim 17, wherein each charge generation layer comprises one or more layers formed of organic materials, inorganic materials, metals, metallic oxides, or a combination thereof.

26. The OLED device of claim 17, wherein each charge generation layer comprises an n-type doped electron-transport layer, a p-type doped hole-transport layer, or a combination thereof.

27. The OLED device of claim 17, wherein the cathode is formed of an electrically conductive material having a high work function.

28. The OLED device of claim 27, wherein the conductive material comprises Al, Ag, Au, Ni, Pt, PEDOT, ITO, IZO, ZnO, AZO(Al:ZnO), GITO(Ga:In:Sn:O), ZITO(Zn:In:Sn:O), or a combination thereof.

* * * * *